United States Patent
Lee et al.

(10) Patent No.: US 7,395,494 B2
(45) Date of Patent: Jul. 1, 2008

(54) APPARATUS FOR ENCODING AND DECODING OF LOW-DENSITY PARITY-CHECK CODES, AND METHOD THEREOF

(75) Inventors: Sang-Hyun Lee, Busan (KR); Kwang-Soon Kim, Daejeon (KR); Yun-Hee Kim, Daejeon (KR); Jae-Young Ahn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 813 days.

(21) Appl. No.: 10/964,122

(22) Filed: Oct. 12, 2004

(65) Prior Publication Data
US 2005/0149840 A1 Jul. 7, 2005

(30) Foreign Application Priority Data
Dec. 22, 2003 (KR) ............ 10-2003-0095032
Jul. 14, 2004 (KR) ............ 10-2004-0054749

(51) Int. Cl.
*G06F 11/00* (2006.01)
(52) U.S. Cl. ...................................... 714/801
(58) Field of Classification Search ............. 714/801
See application file for complete search history.

(56) References Cited

U.S. PATENT DOCUMENTS

| 6,961,888 | B2 * | 11/2005 | Jin et al. ............. 714/752 |
| 2003/0033575 | A1 | 2/2003 | Richardson et al. |
| 2005/0246616 | A1 * | 11/2005 | Choi et al. ............ 714/801 |

FOREIGN PATENT DOCUMENTS

| KR | 1020020095749 A | 12/2002 |
| KR | 1020030016720 A | 3/2003 |

* cited by examiner

*Primary Examiner*—Shelly Chase
(74) *Attorney, Agent, or Firm*—Blakely, Sokoloff, Taylor & Zafman LLP

(57) ABSTRACT

An LDPC code encoding apparatus includes: a code matrix generator for generating and transmitting a parity-check matrix comprising a combination of square matrices having a unique value on each row and column thereof; an encoding means encoding block LDPC codes according to the parity-check matrix received from the code matrix generator; and a codeword selector for puncturing the encoded result of the encoding means to generate an LDPC codeword. The code matrix generator divides an information word to be encoded into block matrices having a predetermined length to generate a vector information word. The encoding means encodes the block LDPC codes using the parity-check matrix divided into the block matrices and a Tanner graph divided into smaller graphs in correspondence to the parity-check matrix.

18 Claims, 11 Drawing Sheets

$$\begin{Bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 1 & 0 & 0 & 0 & 1 \\ 0 & 1 & 0 & 0 & 0 & 1 & 1 & 0 & 0 \\ 0 & 0 & 1 & ① & 0 & 0 & ⓪ & 1 & 0 \end{Bmatrix}$$

110  120  100

$$\begin{bmatrix} \gamma_1 & 0 & 0 & \gamma_7 & 0 & 0 & \gamma_{13} & 0 & 0 \\ 0 & \gamma_3 & 0 & 0 & \gamma_9 & 0 & 0 & \gamma_{15} & 0 \\ 0 & 0 & \gamma_5 & 0 & 0 & \gamma_{11} & 0 & 0 & \gamma_{17} \\ \gamma_2 & 0 & 0 & 0 & \gamma_{10} & 0 & 0 & 0 & \gamma_{18} \\ 0 & \gamma_4 & 0 & 0 & 0 & \gamma_{12} & \gamma_{14} & 0 & 0 \\ 0 & 0 & \gamma_6 & \boxed{\gamma_8} & 0 & 0 & \boxed{0} & \gamma_{16} & 0 \end{bmatrix}$$

311    312    310

$$\begin{bmatrix} 0 & 0 & 1 & 0 \\ 0 & 0 & 0 & 1 \\ 1 & 0 & 0 & 0 \\ 0 & \boxed{1} & 0 & \boxed{0} \end{bmatrix}$$

321   322  320

APPARATUS FOR ENCODING AND DECODING OF LOW-DENSITY PARITY-CHECK CODES, AND METHOD THEREOF

CROSS REFERENCE TO RELATED APPLICATION

This application claims priority to and the benefit of Korea Patent Application No. 2003-95032 filed on Dec. 23, 2003 in the Korean Intellectual Property Office, the entire content of which is incorporated herein by reference.

BACKGROUND OF THE INVENTION (a) Field of the Invention

The present invention relates to an apparatus for encoding and decoding of LDPC (Low-Density Parity-Check) codes, and a method thereof. More specifically, the present invention relates to an apparatus for encoding and decoding of LDPC codes that enables a design of encoding and decoding, and a method thereof.

(b) Description of the Related Art

An LDPC code is a linear block code invented by Gallager in 1962 and defined as a sparse parity-check matrix in which most of the elements are zero. Namely, the sparse matrix is one in which most of the elements have a value of zero.

The LDPC code was almost forgotten since the expense of its implementation was too high at that time. Recently, it was rediscovered in 1995 and further improved as an irregular LDPC code by generalization in 1998.

A statistic decoding algorithm for the LDPC code was also invented at the time of Gallager's first discovery of the LDPC code. The performance of the LDPC code decoded by the algorithm is remarkably high and improved by expansion of a codeword from binary codes to non-binary codes.

Like a turbo code, the LDPC code has a bit error rate (BER) very close to the Shannon channel capacity limit. An irregular LDPC code known to have the highest performance needs only 0.13 dB from the Shannon channel capacity to get a bit error rate (BER) of $10^{-6}$ when its code length is about one million ($10^6$) bits in the additive white Gaussian noise (AWGN) channel environment. For that reason, the irregular LDPC code is suitable for applications that require a high-quality transmission environment having a considerably low bit error rate (BER).

Unlike the algebraic decoding algorithm that is a decoding method for normal block codes, the LDPC code decoding algorithm is a probabilistic decoding method that adopts a belief propagation algorithm based on the graph theory and the statistic prediction theory.

An LDPC decoder calculates the probability that each bit in a codeword received through a channel is equal to 1 or 0. The probability information calculated by the decoder is called the "message," and the quality of the message is checked for each parity defined in a parity-check matrix. The calculated message when a specific parity of the parity-check matrix is satisfied is called the "parity-check message," which indicates the most likely value for each codeword bit. The parity-check message for each parity is used to determine the value of the corresponding bits, and the calculated bit information is called the "bit message."

In this iterative message-passing process, the bit information of each codeword satisfies all the parities in the parity-check matrix. The codeword decoding process ends at the time when all the parities in the parity-check matrix are satisfied. The systematic codes are commonly used in the channel environment having a low signal-to-noise ratio to extract a specific part of the codeword and regenerate information bits. The term "systematic code" as used herein refers to a code made to provide an information word as a part of the codeword. Namely, the systematic code is a code to definitely divide a codeword into an information word part and an additional part provided for error correction.

Generally, codes suitable for graph decoding are LDPC codes, and decoding algorithms for decoding the LDPC codes include a sum-product algorithm and a min-sum algorithm. The sum-product algorithm for decoding the LDPC codes exhibits an optimal performance when the Tanner graph has no cycle. The min-sum algorithm is less complex than the sum-product algorithm but inferior in performance. A structure designed for correction of all losses during the decoding process to solve this problem is too complex to implement hardware or software.

Korean Patent Application No. 2001-33936 (filed on Jun. 15, 2001) discloses an invention under the title of "Graph Decoding Method Using Block Correction", which relates to a graph decoding method using block correction by adding a correction factor to the min-sum algorithm for decoding LDPC codes to achieve a decoding performance close to that of the sum-product algorithm.

More specifically, the cited invention provides a graph decoding method using partial correction by adding a correction factor in consideration of a combination of K sites for the most inputs of a min operation causing a performance deterioration in the min-sum algorithm, i.e., a combination of K sites most frequent in the min-sum algorithm, to achieve a performance approaching that of the sum-product algorithm without increasing the complexity of the min-sum algorithm too much.

According to this cited invention, a correction device is applied to the most effecting codeword to improve the algorithm, guaranteeing a performance equivalent to that of the original decoding algorithm with relatively less hardware.

Korean Patent Application No. 2001-50423 (filed on Aug. 21, 2001) by the applicant of the present invention discloses an invention under the title of "Apparatus for Adaptively Determining Maximum Number of Decoding Iterations for LDPC Decoder Using Signal-to-Noise Ratio Estimation, Method thereof, LDPC Decoding Apparatus Including the Apparatus, and Method thereof."

More specifically, the apparatus for adaptively determining the maximum number of decoding iterations for an LDPC decoder according to the cited invention estimates a signal-to-noise ratio corresponding to a received LDPC encoded signal and adaptively determines the maximum number of decoding iterations corresponding to the estimated signal-to-noise ratio based on a memory storing maximum numbers of decoding iterations corresponding to various signal-to-noise ratios.

According to the cited invention, a signal-to-noise ratio corresponding to a received signal is estimated to adaptively determine the maximum number of decoding iterations to satisfy a required performance. This reduces the average number of decoding iterations and hence a delay of the signal but increases the number of calculations.

U.S. Pat. No. 6,633,856 (filed on Oct. 10, 2001) discloses an invention under the title of "Method and Apparatus for Decoding LDPC codes," which relates to a method and apparatus for decoding a codeword using LDPC codes and a message-passing decoding algorithm used for long codes.

More specifically, the cited invention is directed to a method for encoding a codeword having a large graph comprising a plurality of small graphs of the same size, in which method the large graph is configured from a plurality of small graphs using an algorithm for substitution of columns in a matrix. The column substitution algorithm can be implemented with a message-passing function among the small graphs. The messages corresponding to the small graphs are collectively stored in one memory and written in or read out of the memory by a SIMD write/read command. The graph substitution operation can be configured by a simple message rearrangement command, and the substitution command can also be used for a cyclic substitution. Therefore, a message set read out of one message set memory is rearranged in sequence by cyclic substitution and passed to a processor circuit for a small graph to be processed in the next time.

This cited invention includes a function of efficient storing and reading of a memory for parallel processing of a decoder, thereby simplifying an implementation structure of the decoder with an enhanced high speed.

The LDPC codes are generated using a basically random designing configuration method, so all the information about the random parity-check matrix should be stored in a memory so as to configure an encoder or a decoder for the LDPC codes. This means that all the locations of nonzero elements on the parity-check matrix must be stored. However, the number of 1s increases with an increase in the size of the parity-check matrix for the codes, greatly increasing the value of information to be stored.

In addition, the random characteristic of the parity-check matrix more complicates an address searching and a read/write operation of information for a memory in the encoder/decoder, and also increases the number of factors to be considered in the code generating process, making it difficult to generate codes for high performance.

SUMMARY OF THE INVENTION

It is an advantage of the present invention to provide an apparatus and method for encoding and decoding of LDPC codes that reduces the size of a memory for storing a parity-check matrix and provides a simple substitute for the operations of a decoder to realize high-speed and simple hardware.

In one aspect of the present invention, there is provided an apparatus for encoding of LDPC (Low Density Parity Check) codes that is for encoding using LDPC codes, the apparatus including: a code matrix generator for generating and transmitting a parity-check matrix comprising a combination of square matrices having a unique value on each row and column thereof; an encoding means encoding block LDPC codes according to the parity-check matrix received from the code matrix generator; and a codeword selector for puncturing the encoded result of the encoding means to generate an LDPC codeword.

The code matrix generator divides an information word to be encoded by block matrices having a predetermined length to generate a vector information word.

The block matrices include a combination of sub-matrices having a unique value on each row and column thereof, the block matrices constituting a triangulated matrix.

The encoding means encodes the block LDPC codes using the parity-check matrix divided into the block matrices and a Tanner graph divided into smaller graphs corresponding to the block matrix.

The encoding means performs a parallel operation of the codeword in units of vector in correspondence to the parity-check matrix.

In another aspect of the present invention, there is provided an apparatus for decoding of LDPC codes that is for decoding LDPC codewords encoded with LDPC codes, the apparatus including: a codeword synthesizer for dividing a message comprising the LDPC codewords into a predetermined length to generate a vector message; a decoding means for receiving the vector message from the codeword synthesizer and performing a parallel decoding of the codewords in units of vector message; and an information restoring means for restoring the codewords decoded by the decoding means to an information word.

The codeword synthesizer fills a punctured portion of the LDPC codeword with a soft decision value (typically, positive infinity) corresponding to the codeword 0 to generate a vector message.

The decoding means searches for a cycle by a message-passing decoding method to generate a matrix comprising a combination of square matrices having a unique value on each row and column thereof.

The decoding means substitutes the message-passing decoding process by a cyclic shift operation to perform a parallel operation.

In still another aspect of the present invention, there is provided a method for encoding of LDPC codes that is for encoding an information word to be encoded with LDPC codes, the method including: (a) dividing the information word to be encoded into block matrices having a predetermined length to generate a vector information word; (b) generating a parity-check matrix comprising the divided block matrices; (c) encoding the codeword by parallel calculation in units of vector in correspondence to the parity-check matrix; and (d) puncturing the encoding result to generate a LDPC codeword.

The block matrices of the step (a) include a combination of sub matrices having a unique value on each row and column thereof, the block matrices constituting a triangulated matrix.

The step (b) includes configuring an overall parity-check matrix corresponding to the triangulated matrix constructed in the step (a).

The overall parity-check matrix using triangulated matrix includes cyclic shift and binary addition.

The step (b) includes: generating a parity-check matrix having 1- or 0-valued elements from given parameters; and replacing the 1-valued elements of the parity-check matrix with one selected from the sub matrices.

The step (c) includes encoding the codeword using the parity-check matrix divided into the block matrices and a Tanner graph divided into smaller graphs corresponding to the parity-check matrix.

The divided Tanner graphs are constructed into regular graphs, the regular graphs being constructed into pseudo random graphs constituting each component of the overall graph.

In a further aspect of the present invention, there is provided a method for decoding of LDPC codes that is for decoding an LDPC codeword encoded with LDPC codes, the method including: (a) dividing a message to be decoded into a predetermined length to generate a vector message; (b) receiving the vector message and parallel-decoding the codeword in units of vector; and (d) restoring the LDPC codeword to an information word using the parity-check matrix.

In still another aspect of the present invention, there is provided a method for generating a parity-check matrix of LDPC codes that is for generating an LDPC code matrix encoded with LDPC codes, the method including: (a) searching for a cycle by a message passing decoding method to generate a matrix comprising a combination of square matrices having a unique value on each row and column thereof; (a) searching for a cycle by a message-passing decoding method to generate a matrix comprising a combination of square matrices having a unique value on each row and column thereof, (b) determining 1-locations in the parity-check matrix by cycle searching; and (c) selecting one of a predetermined number of digits available for the 1-locations of the parity-check matrix, and allocating nonzero elements of the parity-check matrix. and configuring a parity-check matrix;

According to the present invention, an input message communicated in the decoder is divided into a predetermined length, and each divided message is discriminated as a vector message, realizing a parallel processing of the message during a message-passing decoding process to improve the processing speed of the decoder and simplify the structure of the decoder. The vector messages in the predetermined length simplify a parity-check matrix needed for a setting configuration of a message-passing encoder/decoder to reduce the size of an associated Tanner graph and hence a size of the memory used. In addition, the calculation and update of each vector message are substituted with simple operations to achieve a regular implementation of basic blocks of a calculator for message-passing functions.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the speci-fication are omitted, and parts for which similar descriptions are provided have the same reference digits.

According to an embodiment of the present invention, the conception that one Tanner graph is a combination of a plurality of smaller regular Tanner graphs considerably simplifies implementation of a decoder in hardware, allows parallel processing of the calculations of the decoder to achieve a high-speed encoding process otherwise taking a longer time than a decoding process, and readily reduces the cycle length of the Tanner graph that seriously affects the performance of a message-passing decoder, resulting in a simple configuration of a high-speed encoder/decoder with remarkably improved performance.

Figures 1, 2:
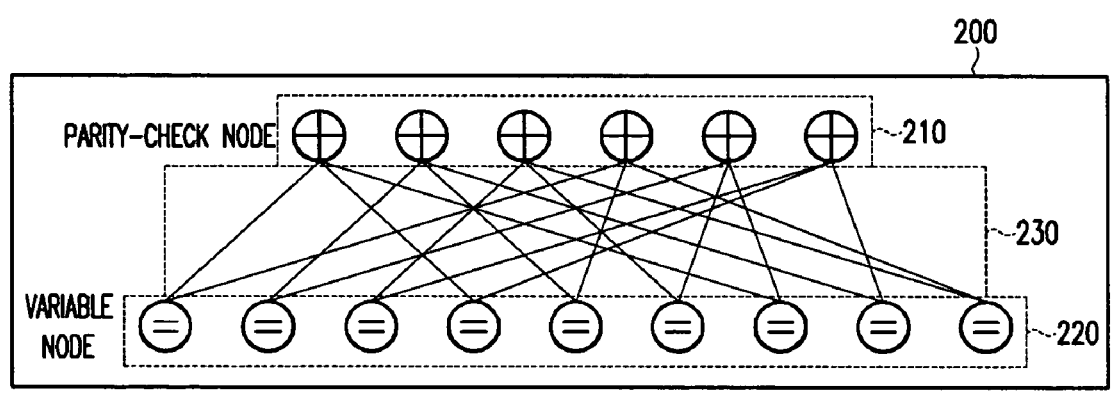
FIG. 1 is an exemplary illustration of a parity-check matrix to construct an LDPC code.
FIG. 2 is an exemplary illustration of the Tanner graph of FIG. 1.

FIG. 1 is an illustration of a parity-check matrix to construct an LDPC code, and FIG. 2 is an illustration of Tanner graph 200 of FIG. 1.

Referring to FIGS. 1 and 2, the LDPC code is encoded/decoded using a sparse parity-check matrix 100 with a minimum number of nonzero elements 110 other than zero (0) elements 120, and an associated parity-check matrix.

In decoding the LDPC code, a graph called a "Tanner graph" 200 is defined by the sparse parity-check matrix, and a message-passing algorithm is applied to the graph.

The Tanner graph 200 comprises nodes 210 and 220, and an edge 230. The nodes 210 and 220 are divided into a parity-check node 210 for a parity-check message, and a bit node 220 for a bit message.

The number of the parity-check nodes 210 is equal to the length of the column in a parity-check matrix 100 of FIG. 1, and the number of the bit nodes 220 is equal to the length of the row in the parity-check matrix 100. The nodes 210 and 220 represent each row and column of the matrix, respectively. The edge 230 denotes an element other than zero (0) in the parity-check matrix 100.

The leftmost edge of FIG. 2 connecting the first parity-check node 210 and the first bit node 220 denotes the element (1, 1) of the parity-check matrix 100. Likewise, the edge connecting the first bit node 220 and the fourth parity-check node 210 denotes the element (4, 1) of the parity-check matrix 100. The code constructed in this way has a completely random structure.

Simplified forms of the parity-check matrix 100 of a random structure according to an embodiment of the present invention are expressed as follows.

Figures 3A, 3B, 3C:
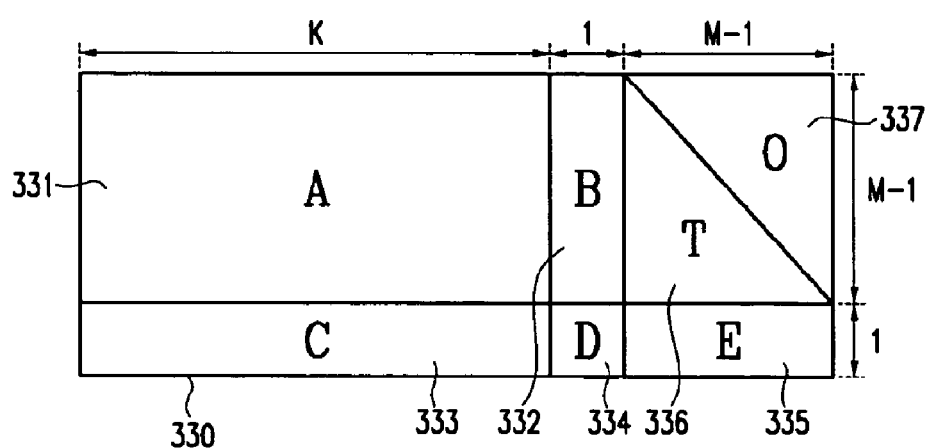
FIGS. 3a, 3b and 3c are exemplary illustrations of a parity-check matrix, a sub matrix, and a triangulated matrix according to an embodiment of the present invention, respectively.

FIGS. 3a, 3b and 3c are exemplary illustrations of a parity-check matrix 310, a sub matrix 320, and a triangulated matrix 330 according to an embodiment of the present invention, respectively.

Referring to FIG. 3, the block parity-check matrix 310 comprises zero (0) elements 312, and nonzero elements 311. The block parity-check matrix 310 gives a new type of parity-check matrix when the overall parity-check matrix for code is divided into sub matrices 320.

Hence, each component of the block parity-check matrix 310 can be substituted with the sub matrix 320. For M×N block parity-check matrix 310 and p×p sub matrix 320, the size of the actual parity-check matrix for code is Mp×Np. With a 6×9 parity-check matrix and a 4×4 sub matrix, for example, the size Mp×Np of the actual parity-check matrix for code is 24×36.

The zero (0) component 312 of the block parity-check matrix 310 means a p×p zero matrix, and the nonzero component 311 has any one of p digits, each of which means one of p sub matrices 320. The sub matrix 320 comprises p 1-valued components 321 and zero (0) components 322 for the rest.

The sub matrix 320 has one 1-valued component 321 per column and row, so the total number of one in a p×p sub matrix is p.

The parity-check matrix divided by the aforementioned method can be expressed as the triangulated matrix 330 so as to facilitate encoding and decoding. Each of block matrices A, B, C, D, E, T and O 331 to 337 constituting the triangulated matrix 330 means a block matrix of which each component comprises sub matrices 320. The term "triangulated matrix" as used herein refers to a matrix retrieved by taking an upper or lower triangular part with respect to the principal diagonal of a general matrix as an arrangement, to guarantee an efficient use of a memory for the arrangement.

K (=N−M) in FIG. 3c is a value related to the length of an input message. The length of the input message in the encoder is K×p. The block matrix T 336 has diagonal components that are all nonzero, and the block matrix 337, i.e., the upper triangular part, comprises zero (0) matrices.

For expediency in encoding, the block matrix B 332 and the block matrix E 335 comprise a column vector having a column length of 1 and a row vector having a row length of 1, respectively.

By replacing the respective components of the triangulated matrix 330 with the sub matrices 320, the overall parity-check matrix can be constructed.

An encoder/decoder for LDPC codes that performs an encoding/decoding using a parity-check matrix and an associated Tanner graph according to an embodiment of the present invention will be described as follows.

Figure 4:
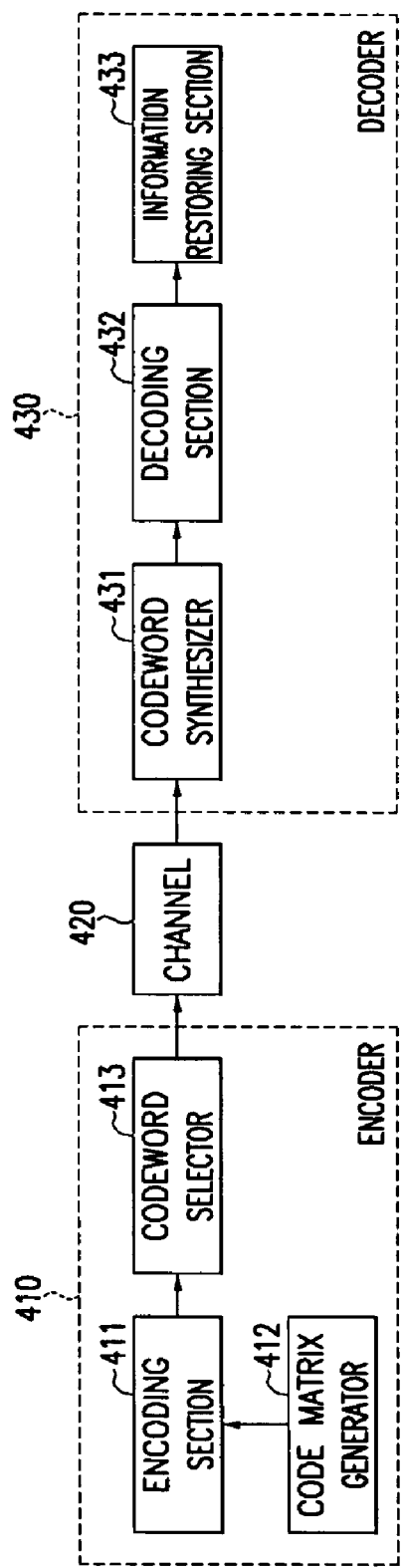
FIG. 4 is a schematic of an encoder/decoder for LDPC codes according to an embodiment of the present invention.

FIG. 4 is a schematic of an encoder and a decoder for LDPC codes according to an embodiment of the present invention.

Referring to FIG. 4, the encoder 410 comprises an encoding section 411, a code matrix generator 412, and a codeword selector 413. The decoder 430 comprises a codeword synthesizer/regenerator 431, a decoding section 432, and a data decoder 433 used as an information restoring section.

The encoding section 411 of the encoder 410 encodes an information word using a M×N parity-check matrix according to an embodiment of the present invention, and outputs a stored parity-check matrix or generates a new parity-check matrix by the user's manipulation.

The codeword selector 431 punctures zero (0) so as to equalize the different lengths of the codeword.

The codeword encoded in a constant length by the codeword selector 413 is fed into the decoder 430 through a channel 420 and decoded into the original information word.

Namely, the input and the output of the encoder 410 are K×p and N×p in length, respectively, each of which is a multiple of p, according to the matrix structure of FIGS. 3a, 3b and 3c. Generally, codewords of different lengths are used, so the codeword selector 413 equalizes the length of the codewords by puncturing of the codewords.

The result of the encoding method according to an embodiment of the present invention is as follows when the length of the information word to be encoded is K', the length of the codeword to be transferred on the channel 420 being N', and neither K' nor N' is a multiple of p.

K×p−K' 0s are added to the information word to increase the length of the information word to K×p. The codeword has a length of N×p as calculated in the above description, so K×p−N' 0s are punctured among the K×p−K' consecutive 0s first added to the information word. The codeword selector 413 performs this operation.

The encoding section 411 encodes the information word using the M×N parity-check matrix that has a suggested structure according to the embodiment of the present invention. The code is a systematic code, so the codeword includes the original information word. The systematic code is used to extract a specific part of the codeword in a channel environment having a low signal-to-noise ratio and regenerate information bits.

The codeword synthesizer/regenerator 431 in the decoder 430 restores 0s at the punctured 0-locations of the codeword received through the channel 320. The codeword synthesizer/regenerator 431 puts a corresponding soft decision value (typically, positive infinity) to 0s of the codeword, to generate a vector message. The embodiment of the present invention punctures information of which the puncturing locations are already known by the aforementioned method, reducing a performance deterioration caused by puncturing relative to the conventional method in which any location is punctured.

To decode the codeword in which the 0s are restored, the decoding section 432 receives a N×p message x, decodes the message in units of vector, and arranges output vector messages L(Q) in sequence to generate a N×p message.

The parity-check matrices 310 and 330, each of which is the triangulated matrix of FIG. 3c, are first constructed so as to perform an encoding and a decoding according to an embodiment of the present invention with the encoder 410 and the decoder 430 according to the embodiment of the present invention.

The p×p sub matrix 320 that constitutes the triangulated matrices, i.e., parity-check matrices 310 and 330 can be defined as the following Equation 1.

$$a_k = \begin{bmatrix} a_k \\ a_{k+1} \\ \vdots \\ a_{(k+p-1) \bmod p} \end{bmatrix}$$ [Equation 1]

Here, $$a_k = \begin{bmatrix} \underbrace{0 \ldots 0}_{k} & 1 & \underbrace{0 \ldots 0}_{p-k-1} \end{bmatrix}.$$

For $a_k=0$, the sub matrix is a p×p identity matrix. The term "square matrix" as used herein refers to a matrix in which the number of rows is equal to that of columns. The term "identity matrix" as used herein refers to a square matrix in which all the elements on the principal diagonal are 1, and all the other elements are zero (0). The identity matrix is denoted by I or In, where the subscript "n" represents the dimension of row or column. Namely, the identity matrix is a matrix that functions as a digit of 1.

The sub matrix 320 is defined as the Equation 1 to construct the parity-check matrices 310 and 330. The encoding section 411 defines a matrix ζ from the block matrices B, D, E and T 332, 334, 335 and 336 of the triangulated matrix 330 and retrieves an inverse matrix $\zeta^{-1}$ of the following Equation 2 from the matrix ζ.

$$\zeta^{-1} = ET^{-1}B + D$$ [Equation 2]

Here, the block matrices B, D, E and T 332, 334, 335 and 336 and $T^{-1}$ are sparse matrices, but the inverse matrix $\zeta^{-1}$ is not a sparse matrix. The inverse matrix $\zeta^{-1}$ becomes a sparse matrix of the following Equation 5 when the block matrices B and T are defined according to the following Equations 3 and 4, respectively.

$$B = \begin{bmatrix} I \\ 0 \\ \vdots \\ 0 \\ D \end{bmatrix} \quad \text{[Equation 3]}$$

$$T = \begin{bmatrix} I & & & & \\ I & I & & & \\ & I & \ddots & & \\ & & \ddots & I & \\ & & & I & I \end{bmatrix} \quad \text{[Equation 4]}$$

$$\varsigma^{-1} = ET^{-1}B + D = I \quad \text{[Equation 5]}$$

The information word s fed into the encoder 410 is defined as $s = \lfloor s_0 \ldots s_{k_p-1} \rfloor$, where $s_i$ is a 1×p block vector, which is also called a "vector message" in the decoder 430.

For the information word s, the output codeword of the encoder 410 is defined as [s $p_1$ $p_2$]. Each of the block vectors $a_i$, $b_i$, $c_i$, $e_i$ and $t_i$ is the i-th block vector that is a row vector comprising $i_p$-th to $(i+1)_{p-1}$-th elements in the vectors a, b, c, e and t, respectively. $[A]_{i,j}$, $[B]_{i,j}$, $[C]_{i,j}$ and $[T]_{i,j}$ are the j-th column element of the i-th row in the block matrices A, B, C and T, respectively.

The basic operations of vectors used in the encoding section 411 to encode the information word s include additions (+) and cyclic shifts ($\otimes$). The cyclic shift is defined as the following Equation 6.

$$\begin{cases} r_{k_i} \otimes [a_0 a_1 \ldots a_{p-1}]^T = \\ [a_{p-k} \ldots a_{p-1} a_0 \ldots a_{p-k_i 1}]^T \\ 0 \otimes [a_0 a_1 \ldots a_{p-1}]^T = [0 \ldots 0]^T \\ r_{k_i} \otimes r_{k_j} = r_{k_j} \otimes r_{k_i} = r_{(k_i+k_j) \bmod p} \end{cases} \quad \text{[Equation 6]}$$

The inverse matrix $\varsigma^{-1}$ is an identity matrix to satisfy the following Equation 7.

solve $\Sigma_j [T]_{i,j} \otimes q_{j,k} = b_{j,k}$ $r_k = \Sigma_j [E]_{i,j} \otimes q_{j,k}$ $R = [r_0 \ldots r_{B-1}]$ $\varsigma = R + D$ [Equation 7]

According to the Equation 7, $q_{j,k}$ is calculated for each block vector by the sequential substitution method, and the inverse matrix $\varsigma^{-1}$ is determined by algebra of matrices.

The first parity part $p_1$ of the codeword is given by the following Equation 8.

$a_i^T = \Sigma_j [A]_{i,j} \otimes s_j^T$ solve $\Sigma_j [T]_{i,j} \otimes t_j^T = a_i^T$ $e_i^T = \Sigma_j [E]_{i,j} \otimes t_j^T$ $c_i^T = \Sigma_j [C]_{i,j} \otimes s_j^T$ $p_1 = e + c$ [Equation 8]

The second parity part $p_2$ of the codeword is given by the following Equation 9.

$b_i^T = \Sigma_j [B]_{i,j} \otimes (p_1)_j^T$ solve $\Sigma_j [T]_{i,j} \otimes (p_2)_j^T = a_i^T + b_i^T$ All the operations in the Equations 6 to 9 comprise cyclic shifts and binary additions, to realize calculations at high speed. The cyclic shift is not performing an actual calculation but changing the memory reading and writing order of the vector message, allowing an implementation of simple operations and more simplifying parallel operations.

The decoding section 432 of the decoder 430 receives and defines a N×p message x for decoding codes under the parity-check condition of the parity-check matrix as the following Equation 10.

$\Sigma_j [H]_{i,j} \otimes x_j^T = o^T$ [Equation 10]

Here, $x_j$ is a vector message comprising the $i_p$-th element to the $(i+1)_{p-1}$-th element of the vector message x.

The Equation 10 also realizes a message calculation for p variables or check nodes in parallel.

The vector-based decoding in the decoding section 432 is performed as follows.

Here, $\phi(x) = -\log(\tanh(x/2))$, and a function $f(\cdot)$ for one vector message $L(q_{ij})$ is defined as $f(x_k) = \lfloor f(x_{kp}) f(x_{kp+1}) \ldots f(x_{(k+1)p-1}) \rfloor$ in the same way as a definition method for a single variable.

Figure 5:
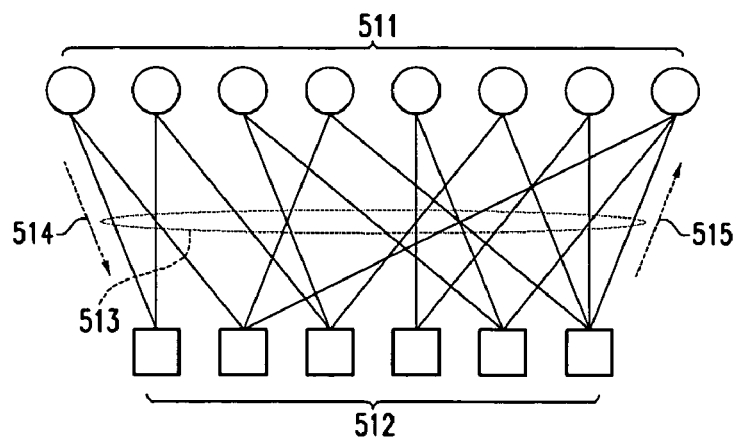
FIG. 5 is an illustration of a parity-check matrix constructed for a parallel processing of a vector message-passing encoder according to an embodiment of the present invention.

FIG. 5 shows a parity-check matrix constructed for a parallel processing of a vector message-passing encoder according to an embodiment of the present invention.

Referring to FIG. 5, the parity-check matrix comprises variable nodes 511, check nodes 512, and edges 513. The edges 513 are determined from the parity-check matrix as defined above in FIG. 2.

First, a vector message $L(x_k) = \lfloor L(x_{kp}) L(x_{kp+1}) \ldots L(x_{(k+1)p-1}) \rfloor$ of LLR (Log Likelihood Ratio) for each bit in the received codeword vector message is calculated, and the input vector message of the check nodes 513 is initialized.

A vector message $L(q_{ij})$ 514 becomes a vector message of LLR for the j-th block codeword given by the entry of the i-th check node 513. The first input of the decoder 430 is transferred to each variable node 511, and the output to each edge 513 connected to each variable node 511 is defined as the following Equation 11.

$L(q_{ij}) = L(x_j) \cdot \Gamma_{P_{ij}}^T$ [Equation 11]

In the Equation 11, the matrix algebra is defined equal to the multiplication of matrices, but the matrix $\Gamma_{P_{ij}}^T$ represents a p×p matrix defining an operation of nonzero components in the parity-check matrix.

The vector message passed to each check node 512 is transferred to the edge 515 connected to each check node according to the following Equation 12.

$$L(r_{ij}) = \left( \left( \prod_{j' \in R(i)/j} \operatorname{sign}(L(q_{ij'})) \right) \cdot \phi \left( \sum_{j' \in R(i)/j} \phi(|L(q_{ij'})|) \right) \right)_{entrywise} \quad \text{[Equation 12]}$$

Here, the edge 515 $L(r_{ij})$ is an output vector message of the j-th check node 512 fed into the j-th variable node 511. The respective components in the vector are operated with one another, for the function and the calculation of the vectors according to the Equation 12. R(i) is an index set of the variable nodes 511 connected to the check nodes i 512. R(i)/j is an index set of the variable nodes 511 connected to the check nodes i 512 other than j.

The operation $(\cdot)_{entrywise}$ of the Equation 12 means the multiplication of components in the vector, and the output vector message of each variable node 512 after initialization is given by the Equation 13.

$$L(q_{ij}) = L(x_j) \cdot \Gamma_{p_{ij}}^T + \left( \sum_{i' \in C(j)/i} L(r_{i'j}) \Gamma_{p_{i'j}} \right)^T \cdot \Gamma_{p_{ij}}^T \quad \text{[Equation 13]}$$

Here, C(j) is an index set of check nodes connected to the variable nodes j 511; and C(j)/i is an index set of the check nodes 512 connected to the variable nodes j 511 other than i.

The vector message passed to the data decoder 433 after processing each variable node 511 and each check node 512 is given by the following Equation 14.

$$L(Q_i) = L(x_j) + \sum_{i \in C(j)} L(r_{ij}) \cdot \Gamma_{p_{ij}} \quad \text{[Equation 14]}$$

Here, $L(Q_i)$ is an updated vector of LLR for each bit of the i-th block codeword. The respective components in the vector are operated with one another, for the function and the calculation of the vectors according to the Equation 14. The data decoder 433 arranges the output vector messages $L(Q_i)$ of the decoding section 432 in sequence to generate a N×p message.

As described above, the codeword is decided from the generated message according to the following Equation 15.

$$\hat{x}_{ip+j} = \begin{cases} 1 & \text{if } L(Q_i)_j < 0, \\ 0 & \text{otherwise} \end{cases} \quad \text{[Equation 15]}$$

If $\hat{x}H^T=0$ for the information word of the Equation 15, then the parity check is a success, in which case the original k-bit information is extracted as the final output. Otherwise, if $\hat{x}H^T \neq 0$, the steps of the Equations 11, 12 and 13 are iterated.

The code matrix generator 412 of FIG. 4 is controlled to output a previously stored parity-check matrix or to generate a new parity-check matrix. The parity-check matrix is generated from a given degree distribution of the edges.

The method of generating the parity-check matrix is performed in two steps. The first step is generating a parity-check matrix from the given parameters in which the elements are only 1s or 0s. The second step is replacing the 1-locations of the parity-check matrix by one of p sub matrices.

The most important thing in the arrangement of 1s in accord to the degree distribution for a given row/column is to prevent the occurrence of a cycle causing a deterioration of the message-passing decoding performance or to maximize the length of the shortest cycle.

Figure 6:
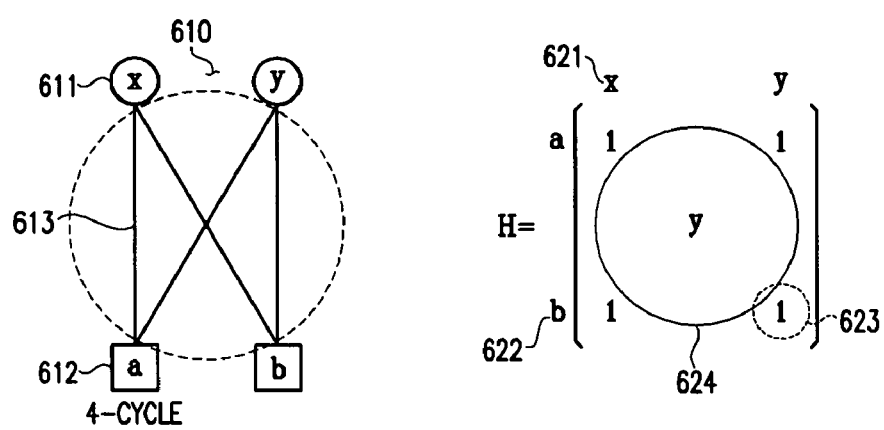
FIG. 6 is an exemplary illustration of a 4-cycle of the Tanner graph according to an embodiment of the present invention.

FIG. 6 is an exemplary illustration of a 4-cycle of a Tanner graph according to an embodiment of the present invention.

Referring to FIG. 6, a Tanner graph 610 according to an embodiment of the present invention has a one-to-one correspondence relationship with a parity-check matrix 620. A cycle 614 of the Tanner graph 610 can also be analyzed on the parity-check matrix 620. A nonzero element 623 in the parity-check matrix 620 means a side 613 connecting a check node 612 and a variable node 611 that have a row location 622 and a column location 621 of the corresponding element as an index, respectively. Therefore, the 4-cycle is expressed as a quadrilateral 624 of which the four edges have a nonzero element in the parity-check matrix 620.

A 6-, 8-, 10-, or 12-cycle can be defined in the same manner. The cycle length of the Tanner graph is an even number in any case.

FIGS. 7a to 7d show the functions of the respective nodes used in a cycle searching process according to an embodiment of the present invention.

Referring to FIGS. 7a to 7d, the message communicated through the edges on the Tanner graph is confined to a digit of 0 or 1, so the function defined for each node to process the message defines the check node and the variable node according to the following Equation 16.

$$y_{ij} = \left( \bigoplus_{j' \in IN(i)} x_{ij'} \right) \otimes x_{ij} \quad \text{[Equation 16]}$$

Here, IN{i} is a set of nodes in another node set adjacent to the i-th node of one node set in a bipartite graph. The operation $\oplus$ is equal to the logical OR, and the operation $\otimes$ is equal to the exclusive OR (XOR).

Therefore, the Equation 16 means that the digit of 0 is passed to an edge having a digit of 1, if any among inputs 711 to the nodes, and that the digit of 1 is passed to the other edges.

Figure 7A:
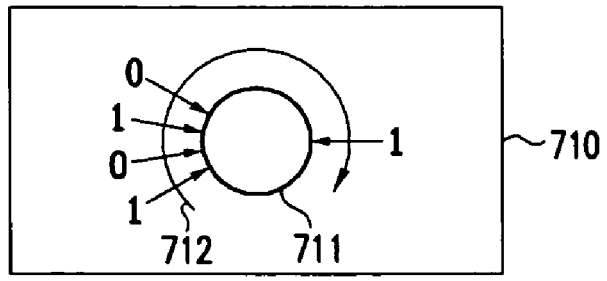
FIGS. 7a to 7d show the functions of the respective nodes used in a cycle searching process according to an embodiment of the present invention.
Figure 7B:
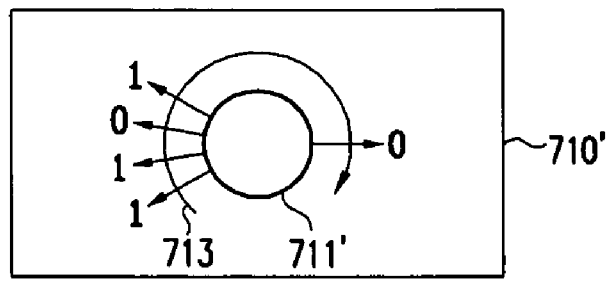
Figure 7C:
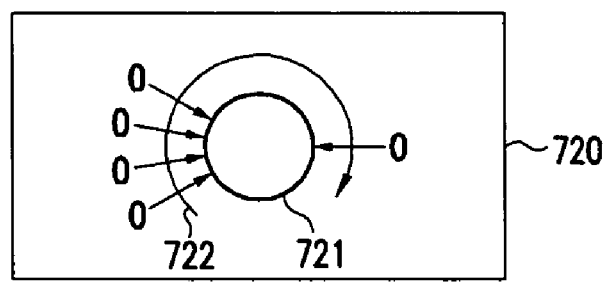
Figure 7D:
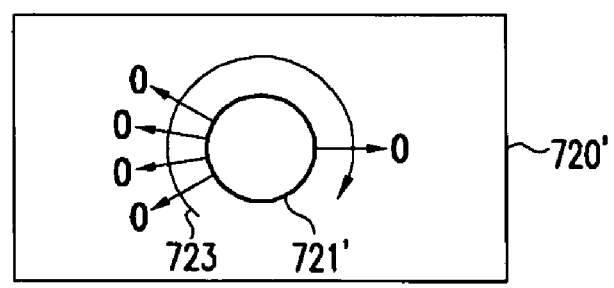
Figure 8A:
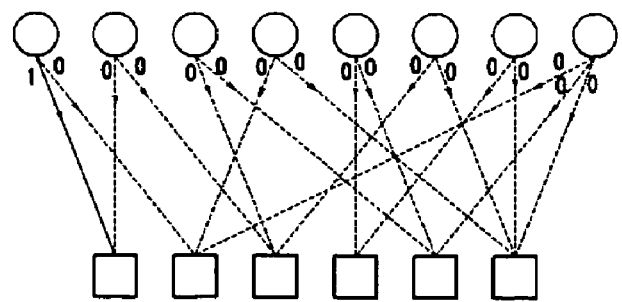
FIGS. 8a to 8h show a cycle searching process for generating a parity-check matrix according to an embodiment of the present invention.
Figure 8B:
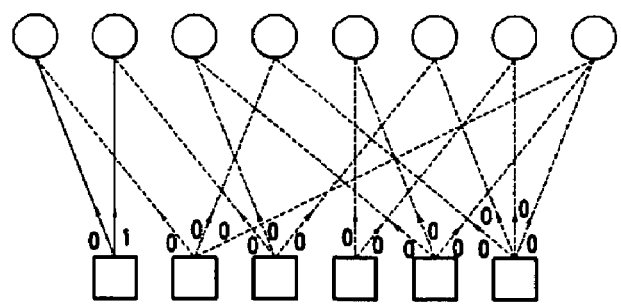
Figure 8C:
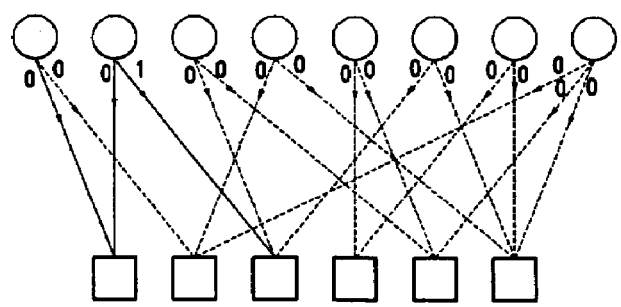
Figure 8D:
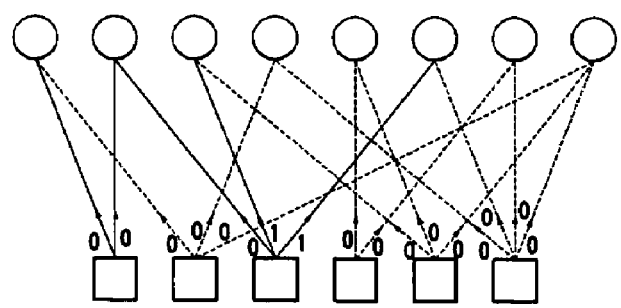
Figure 8E:
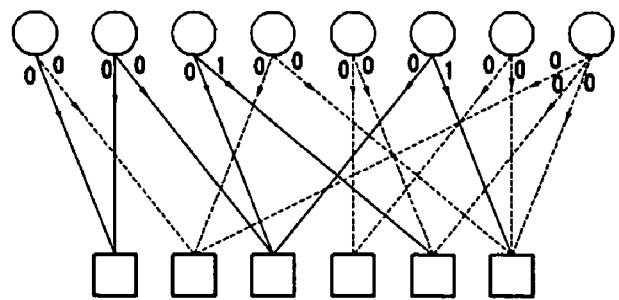
Figure 8F:
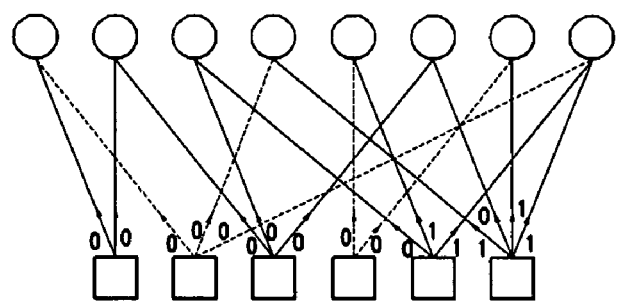
Figure 8G:
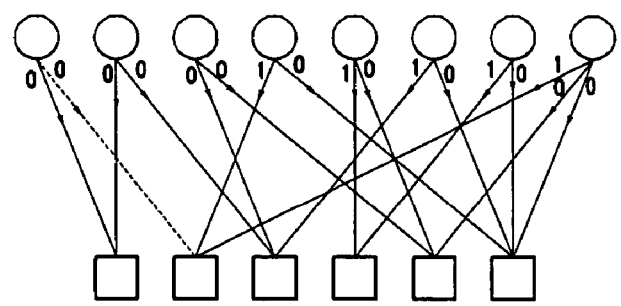
Figure 8H:
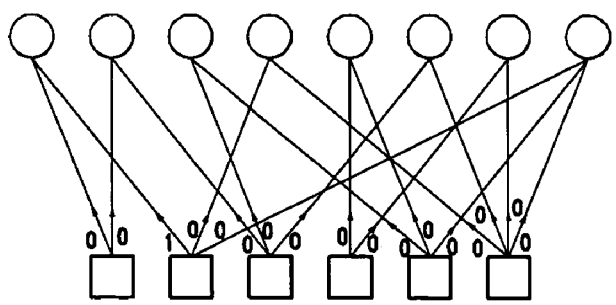

In FIG. 7b, when inputs 722 to a node 711' are all 0s, outputs 723 are all 0s. Namely, the digit of 1 among the input/output values of the node means that the node and the edge belong to the cycle.

It is therefore recognized that there is a cycle when the digit of 1 circulates in the Tanner graph and returns to the node that initially output the digit of 1. In some cases, a certain node receives at least two 1s, which means that there are at least two cycles having a length as much as the number of iterations.

The above-described cycle searching method allocates 1s to the parity-check matrix and proceeds the first step of the code generation process to search for cycles and generate cycles only longer than a desired cycle.

FIGS. 8a to 8h show a cycle searching process for generating a parity-check matrix according to an embodiment of the present invention.

Referring to FIGS. 8a to 8h, the cycle searching begins from a leftmost variable node 811 to find out an 8-cycle.

The second step of the code generating process includes replacing 1s in the parity-check matrix comprising 1s and 0s as generated in the first step by other p digits. The one thing to consider in replacing 1s with other p digits is that the cycle between the elements, if it exists, does not have a direct effect on the parity-check matrix, which is not a parity-check matrix for an actual codeword.

Namely, even when there is a 4-cycle in the parity-check matrix after the first step, the actual cycle may have various lengths due to the relationship among the digits allocated to the nonzero elements on the corresponding cycle. For example, when there is an i-cycle on a parity-check matrix comprising p×p cyclic shift matrices $X_i$, and the nonzero elements on the cycle define a directed tail-biting path, the cycle may be expressed as a finite sequence $\{a_j\}=\{r_{ij}\}_{j=0}^I$ of the digits allocated to these components.

When the alternating sum of the elements in the finite sequence is $$S \equiv \sum_{j=\text{even or }0} i_j - \sum_{j=\text{odd}} i_j (\text{mod } p),$$

and $0 \neq S(\text{mod } p)$, the cycle passes through all 1s of the sub matrix associated with the nonzero elements on it, and the cycle length is $p \times 1$, which is the maximum length available for the cycle. The aforementioned condition is always satisfied when p is selected from relatively prime integers.

The determination of proper digits for nonzero elements in the second step in spite of a cycle occurring in the first step maximizes the length of the actual cycle and reduces a performance deterioration caused by the cycle. Based on this fact, the code matrix generator 412 performs calculations for the second step.

Figure 9A:
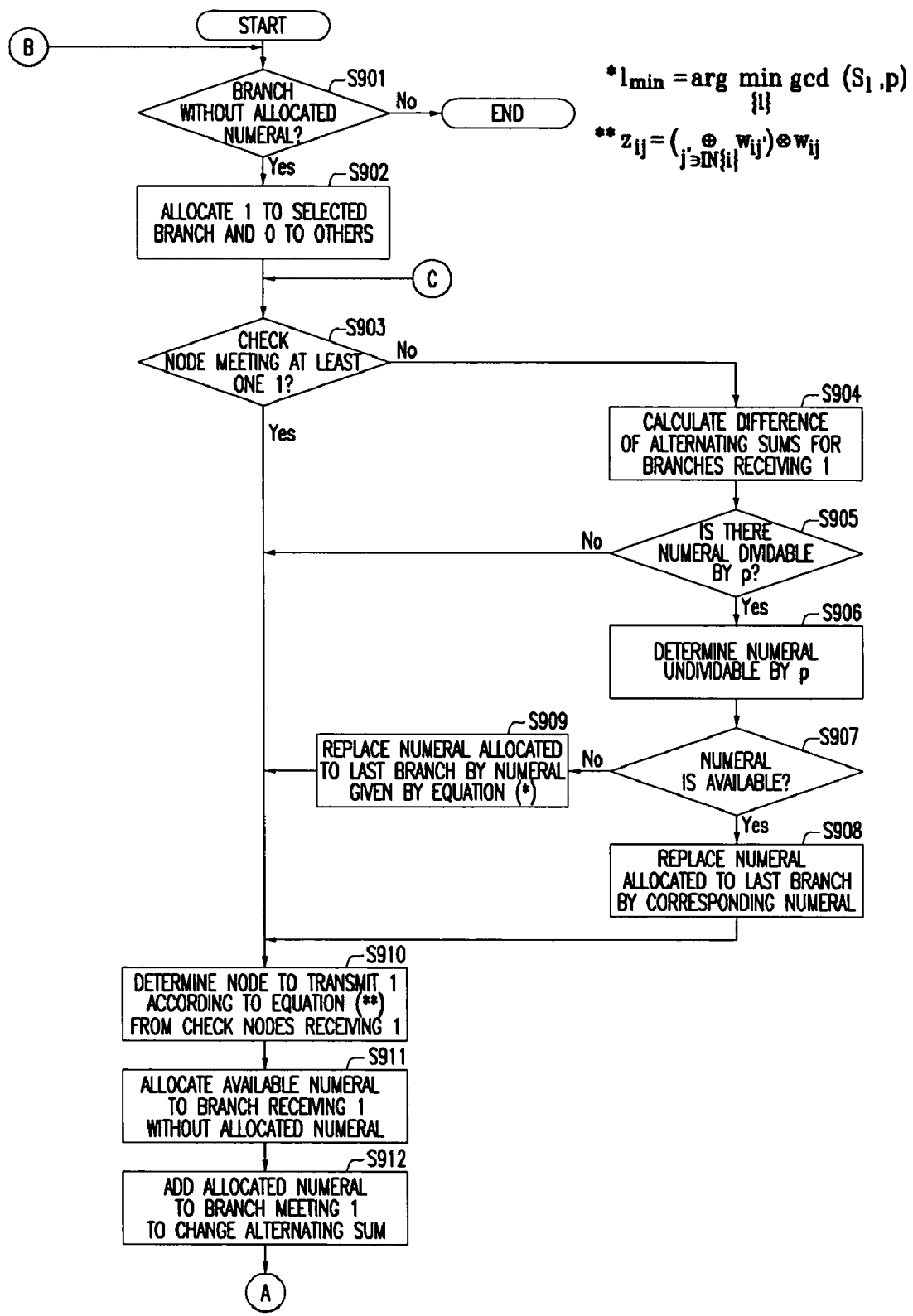
FIGS. 9a and 9b are flow charts of a code generating method using a cycle searching process according to an embodiment of the present invention.
Figure 9B:
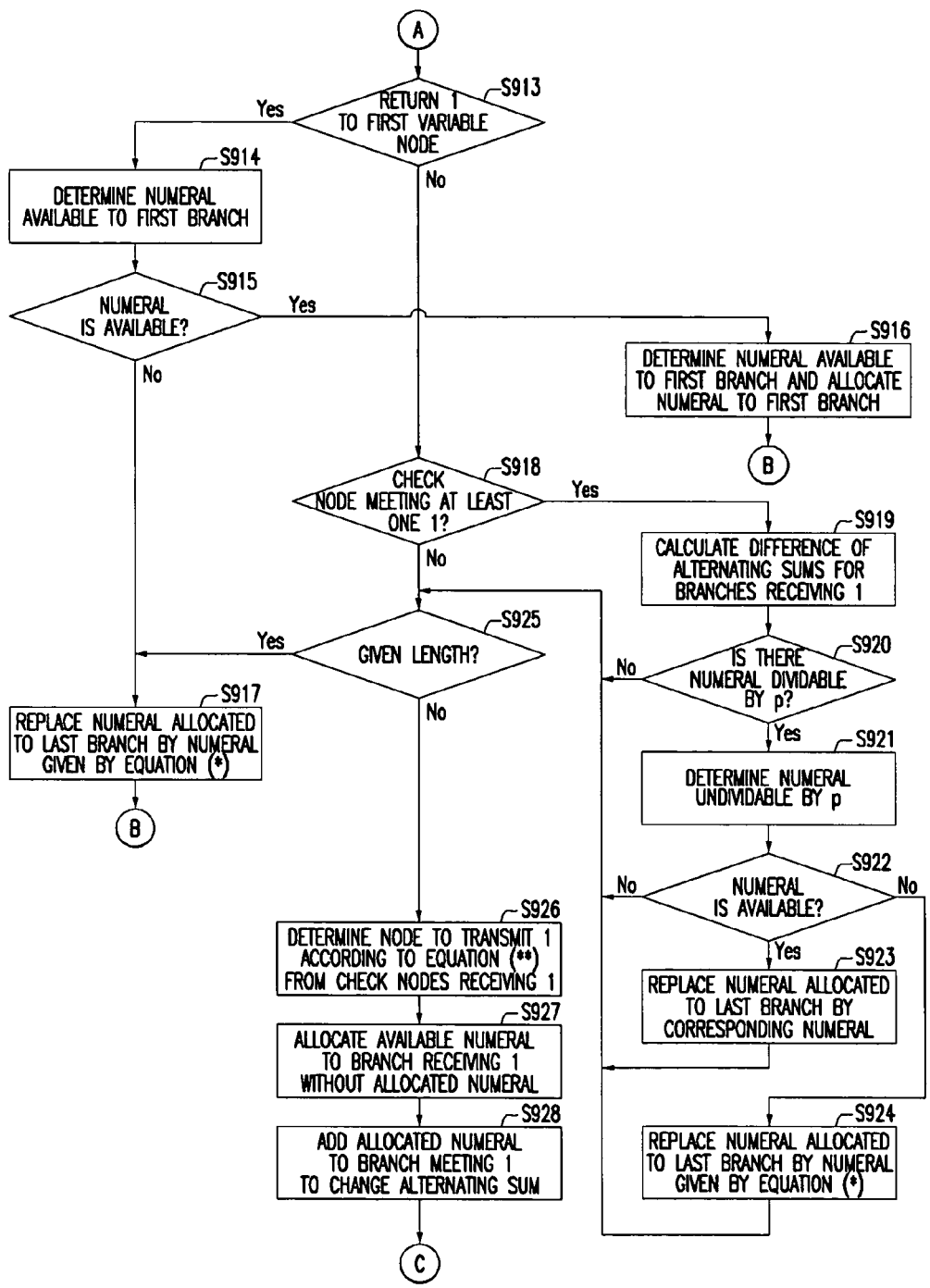
Figure 10A:
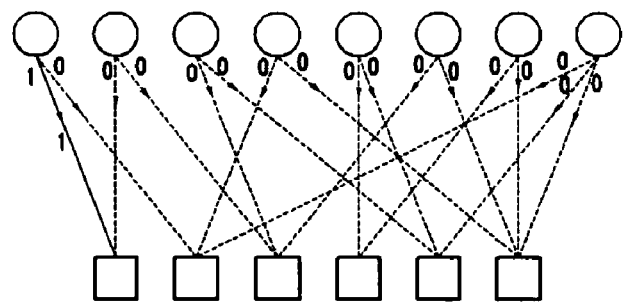
FIGS. 10a to 10h show a process for allocating a corresponding digit to a sub matrix to generate a parity-check matrix according to an embodiment of the present invention.
Figure 10B:
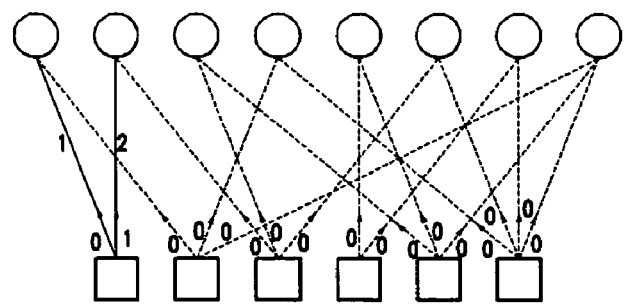
Figure 10C:
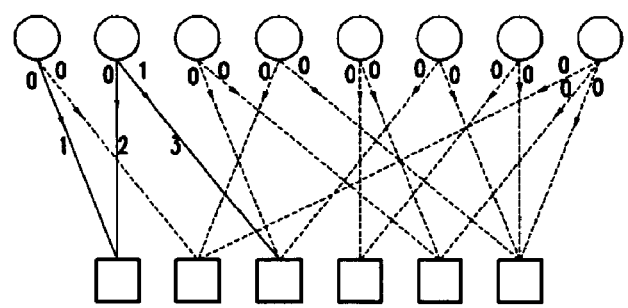
Figure 10D:
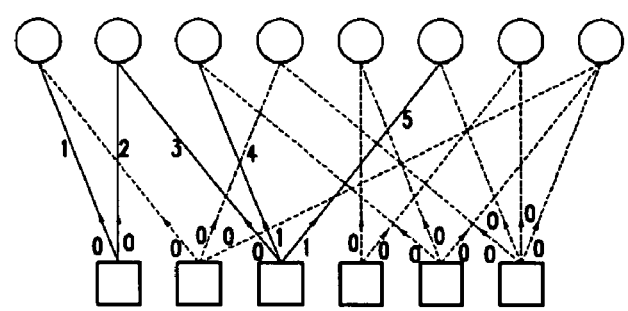
Figure 10E:
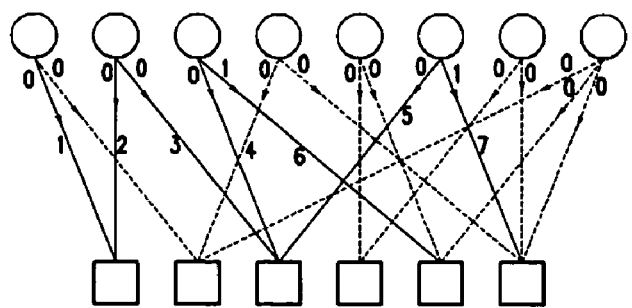
Figure 10F:
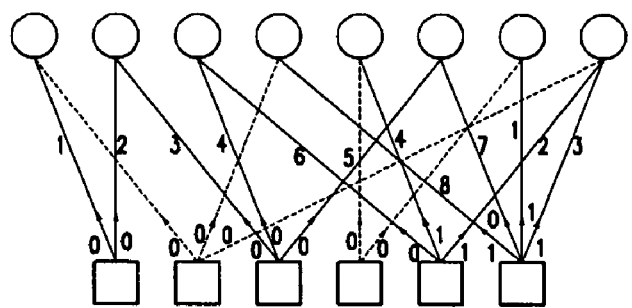
Figure 10G:
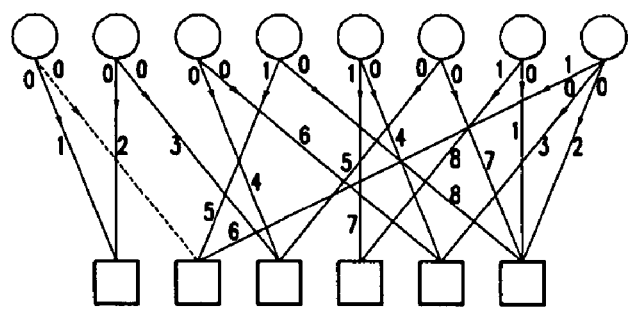
Figure 10H:
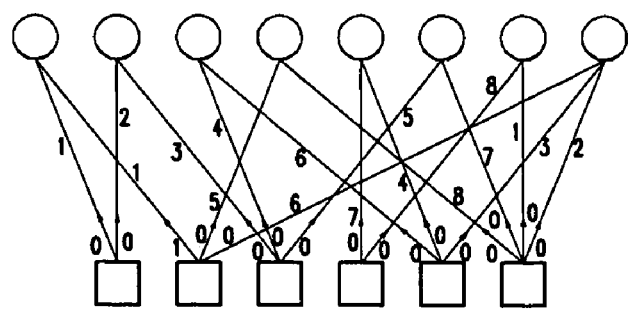

FIGS. 9a and 9b are flow charts of a code generating method using the cycle searching process according to an embodiment of the present invention, which figures illustrate the above-described process.

Referring to FIGS. 9a and 9b, when no digit is allocated to an edge (in S901), the output of the corresponding node is set to 1, the outputs of the other edges being to 0, the alternating sum being to 0 (in S902).

When at least one 1 meets a check node (in S903), the difference of the alternating sums of the respective 1s is determined (in S904). The alternating sum at each check node is calculated according to the check node that meets the corresponding edge having an output of 1.

When the alternating sum S calculated in the step S904 is dividable by p (in S905), a digit integer undividable by p is selected (in S906). If the corresponding integer digit is available (in S907), then the digit allocated to the last of the path is replaced by the corresponding digit (in S908).

When there is no digit available in the step S907, a digit $l_{min}$ to get a least GCD (Greatest Common Divisor) of the alternating sum and p is determined and replaced as the digit allocated to the last edge (in S909).

The digit $l_{min}$ can be expressed as $$l_{min} = \arg\min_{\{l\}} gcd(S_l, p).$$

Here, the cycle length is $p \times l/gcd(S_l,p)$, so the element $l_{min}$ to get the least GCD is selected as an index, maximizing the overall length of the cycle.

When there is no check node meeting at least one 1 in the step S903, the node and the edge to be allocated with 1s are determined among the check nodes having a digit of 1 according to the Equation 13 (in S910). One of the digits available is allocated to, if any, the edge having a digit of 1 still without an allocated digit (in S911).

The allocated digit is added to the edge meeting 1 to determine the alternating sum (in S912). Subsequently, when the node is the first variable node (in S913), a digit available for the starting edge is determined (in S914). When there is a digit available (in S915), a digit to get the least GCD of the alternating sum and p is determined according to $$l_{min} = \arg\min_{\{l\}} gcd(S_l, p)$$

and replaced as the digit allocated to the last edge (in S917). When there is no digit available in the step S915, the digit $l_{min}$ to get the least GCD of the alternating sum and p is determined and replaced as the digit allocated to the last edge (in S916).

It is determined whether there is an edge without a digit allocated thereto (in S901), and the steps S902 to S917 are performed again for the next edge.

When the first variable node has no digit of 1 according to the determination result of the step S913, another variable node meeting at least 1 is searched (in S918). With such a variable node available, the difference of the alternating sums for the edges meeting each 1 is calculated (in S919), and it is determined whether or not the difference of the alternating sums is dividable by p (in S920).

When there is a difference of the alternating sums dividable with p according to the determination result of the step S920, a digit to make the alternating sums undividable by p is determined (in S921). When such a digit is available (in S922), it is replaced as the digit allocated to the last edge (in S923). When there is no digit available in the step S922, the digit $l_{min}$ to get the least GCD of the alternating sum and p is determined and replaced as the digit allocated to the last edge (in S924).

When the cycle length reaches a given length (in S925), a digit available for the first edge is determined and allocated to the corresponding edge, and the steps S901 to S923 are iterated until there is no edge without a digit allocated thereto.

When the cycle length does not reach a given length, an edge to transmit 1 at the node receiving 1 is determined according to the Equation 12 (in S926), and an available digit is allocated to an edge still having no digit allocated thereto among the edges receiving 1 (in S927). The digit is subtracted from the edge meeting 1, to change the alternating sum (in S928). Then the step S903 is performed to determine whether there is another check node meeting at least one 1.

As described above, the code generating method of FIGS. 9a and 9b according to the embodiment of the present invention includes searching for a cycle according to the Equation 13, allocating one of p digits to all the edges in which the calculation result is 1, adding an alternating sum to the corresponding value when the current procedure goes from a check node to a variable node, or subtracting the alternating sum from the corresponding value when the current procedure goes from the variable node to the check node, returning the cycle to the first node to determine whether or not the sum satisfies $0 \neq S(\text{mod } p)$, and repeating the searching step when the sum does not satisfy $0 \neq S(\text{mod } p)$.

When $0 \neq S(\text{mod } p)$ is not satisfied for all p edges, i.e., at least p cycles are associated with the corresponding component, the digit associated with the least number of cycles is determined, and the number of unit graphs of a cycle including an internal cycle is determined. This means that there is a cycle in which paths including internal cycles overlap as many as the number of the internal cycles, making it necessary to store the number of the internal cycles for each component.

When an index set available in selecting a digit dividable by p is $\{l\}$, the digit $l_{min}$ to get the least GCD of p and the alternating sum $S_l$ of the elements of the cycle determined by each element of the index set $\{l\}$ is determined. The cycle length is p×l/gcd($S_l$,p), so the element $l_{min}$ to get the least GCD is selected as an index to maximize the overall length of the cycle.

In this way, the digit is replaced as all 1s and then substituted with sub matrices to generate a final Mp×Np matrix.

FIGS. 10a to 10h are illustrations of a method for allocating a corresponding digit to a sub matrix to generate a parity-check matrix according to an embodiment of the present invention.

Referring to FIGS. 10a to 10h, the result for p=8 in the embodiment of FIGS. 8a to 8h is illustrated and will not be described any more.

The embodiment of the present invention employs a method of dividing a Tanner graph for LDPC code into a plurality of smaller Tanner Graphs and constructing an overall graph. The small graphs are constructed into regular graphs, and a specific operation for each regular graph is performed to construct pseudo random graphs that constitute each component of the overall graph. The graph constructed by this configuration method and the associated parity-check matrix have a pseudo random parity-check matrix rather than a completely random matrix. A replacement of each block unit graph by a specific digit may convert the overall graph to a greatly size-reduced graph.

This method remarkably reduces the size of a memory for storing the parity-check matrix, simply substitutes a message-passing operation of the message-passing decoder with a cyclic shift operation, and realizes a parallel processing of the calculations to achieve implementation of high-speed and simple hardware.

In addition, the cycle length that determines the performance of the codes is given as another simplified condition in this type of graph, to simplify the code generating method and guarantee an enhanced performance.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

The present invention is directed to a method for a parallel processing of an iterative decoder of LDPC codes that divides a received codeword in a predetermined length and processes divided codewords collectively, implementing a high-speed iterative decoding and greatly reducing the size of a memory with an enhanced decoding speed because of the division in units of arrangement.

The present invention is based on a parallel processing of the decoder and a division in units of vector, so the effect of the cycle can be considered for a code matrix generator.

In addition, the present invention minimizes the effect of the cycle to enable a design of codes simply implemented with improved performance and an encoding/decoding with the codes, which method is applicable to any codeword length simply by puncturing.

What is claimed is:

1. An apparatus for encoding of LDPC (Low Density Parity Check) codes, which is for encoding using LDPC codes, the apparatus comprising:
    a code matrix generator for generating and transmitting a parity-check matrix comprising a combination of square matrices having a unique value on each row and column thereof;
    an encoding means encoding block LDPC codes according to the parity-check matrix received from the code matrix generator; and
    a codeword selector for puncturing the encoded result of the encoding means to generate an LDPC codeword.

2. The apparatus as claimed in claim 1, wherein the code matrix generator divides an information word to be encoded into block matrices having a predetermined length to generate a vector information word.

3. The apparatus as claimed in claim 2, wherein the block matrices comprise a combination of sub matrices having a unique value on each row and column thereof, the block matrices constituting a triangulated matrix.

4. The apparatus as claimed in claim 1, wherein the encoding means encodes the block LDPC codes using the parity-check matrix divided into the block matrices and a Tanner graph divided into smaller graphs in correspondence to the parity-check matrix.

5. The apparatus as claimed in claim 1, wherein the encoding means performs a parallel operation of the codeword in units of vector in correspondence to the parity-check matrix.

6. An apparatus for decoding of LDPC codes, which is for decoding LDPC codewords encoded with LDPC codes, the apparatus comprising:
    a codeword synthesizer for dividing a message comprising the LDPC codewords in a predetermined length to generate a vector message;
    a decoding means for receiving the vector message from the codeword synthesizer and performing a parallel decoding of the codewords in units of vector message; and
    an information restoring means for restoring the codewords decoded by the decoding means to an information word.

7. The apparatus as claimed in claim 6, wherein the codeword synthesizer fills a punctured portion of the LDPC codeword with a soft decision value (typically, positive infinity) corresponding to the codeword 0 to generate a vector message.

8. The apparatus as claimed in claim 6, wherein the decoding means searches for a cycle by a message-passing decoding method to generate a matrix comprising a combination of square matrices having a unique value on each row and column thereof.

9. The apparatus as claimed in claim 8, wherein the decoding means substitutes the message-passing decoding process by a cyclic shift operation to perform a parallel operation.

10. A method for encoding of LDPC codes, which is for encoding an information word to be encoded with LDPC codes, the method comprising:
    (a) dividing the information word to be encoded into block vectors having a predetermined length to generate a vector information word;
    (b) generating a parity-check matrix comprising the divided block matrices;
    (c) encoding the codeword by parallel calculation in units of vector in correspondence to the parity-check matrix; and
    (d) puncturing the encoding result to generate a LDPC codeword.

11. The method as claimed in claim 10, wherein the block matrices of the step (a) comprise a combination of sub matrices having a unique value on each row and column thereof, the block matrices constituting a triangulated matrix.

12. The method as claimed in claim 11, wherein the step (b) comprises:
    configuring an overall parity-check matrix corresponding to the triangulated matrix constructed in the step (a).

13. The method as claimed in claim 12, wherein the overall parity-check matrix using the triangulated matrix comprises cyclic shift and binary addition.

14. The method as claimed in claim 10, wherein the step (b) comprises:
generating a parity-check matrix having 1- or 0-valued elements from given parameters; and
replacing the 1-valued elements of the parity-check matrix with one selected from the sub matrices.

15. The method as claimed in claim 10, wherein the step (c) comprises:
encoding the codeword using the parity-check matrix divided into the block matrices and a Tanner graph divided into smaller graphs in correspondence to the parity-check matrix.

16. The method as claimed in claim 15, wherein the divided Tanner graphs are constructed into regular graphs, the regular graphs being constructed into pseudo random graphs constituting each component of the overall graph.

17. A method for decoding of LDPC codes, which is for decoding an LDPC codeword encoded with LDPC codes, the method comprising:

(a) dividing a message to be decoded in a predetermined length to generate a vector message;

(b) receiving the vector message and parallel-decoding the codeword in units of vector; and (d) restoring the LDPC codeword to an information word using the parity-check matrix.

18. A method for generating a parity-check matrix of LDPC codes, which is for generating an LDPC code matrix encoded with LDPC codes, the method comprising:

(a) searching for a cycle by a message passing decoding method to generate a matrix comprising a combination of square matrices having a unique value on each row and column thereof;

(b) determining 1-locations in the parity-check matrix by the cycle searching; and (c) selecting one of a predetermined number of digits available for the 1-locations of the parity-check matrix, and allocating nonzero elements of the parity-check matrix.

* * * * *